(12) United States Patent
Haba et al.

(10) Patent No.: US 10,566,310 B2
(45) Date of Patent: Feb. 18, 2020

(54) MICROELECTRONIC PACKAGES HAVING STACKED DIE AND WIRE BOND INTERCONNECTS

(71) Applicant: Invensas Corporation, San Jose, CA (US)

(72) Inventors: Belgacem Haba, Saratoga, CA (US); Kyong-Mo Bang, Fremont, CA (US)

(73) Assignee: Invensas Corporation, San Jose, CA (US)

( * ) Notice: Subject to any disclaimer, the term of this patent is extended or adjusted under 35 U.S.C. 154(b) by 346 days.

(21) Appl. No.: 15/095,629

(22) Filed: Apr. 11, 2016

(65) Prior Publication Data

US 2017/0294410 A1  Oct. 12, 2017

(51) Int. Cl.
*H01L 25/065* (2006.01)
*H01L 21/48* (2006.01)
(Continued)

(52) U.S. Cl.
CPC ...... *H01L 25/0657* (2013.01); *H01L 21/4825* (2013.01); *H01L 21/565* (2013.01);
(Continued)

(58) Field of Classification Search
CPC . H01L 25/0657; H01L 25/043; H01L 25/117; H01L 21/4825; H01L 21/565;
(Continued)

(56) References Cited

U.S. PATENT DOCUMENTS 3,639,888 A   2/1972 Pittman et al.
4,323,914 A   4/1982 Berndlmaier et al.
(Continued)

FOREIGN PATENT DOCUMENTS

CN   2512114 Y   9/2002
CN   1531069 A   9/2004
(Continued)

OTHER PUBLICATIONS

Cheah, Bok Eng, et al., Modeling and Electrical Characteristics Evaluation of Vertical Side-Chip Internconnection for Compact 3D Integration, School of Electrical and Electronic Engineering, Universiti Sains Malaysia, 13th Electronics Materials and Packaging (EMAP), Nov. 2011.

(Continued)

*Primary Examiner* — Latanya N Crawford
(74) *Attorney, Agent, or Firm* — Lerner, David, Littenberg, Krumholz & Mentlik, LLP

(57) ABSTRACT

A microelectronic package includes at least one microelectronic element having a front surface defining a plane, the plane of each microelectronic element parallel to the plane of any other microelectronic element. An encapsulation region overlying edge surfaces of each microelectronic element has first and second major surfaces substantially parallel to the plane of each microelectronic element and peripheral surfaces between the major surfaces. Wire bonds are electrically coupled with one or more first package contacts at the first major surface of the encapsulation region, each wire bond having a portion contacted and surrounded by the encapsulation region. Second package contacts at an interconnect surface being one or more of the second major surface and the peripheral surfaces include portions of the wire bonds at such surface, and/or electrically conductive structure electrically coupled with the wire bonds.

17 Claims, 8 Drawing Sheets

(51) Int. Cl.
*H01L 21/56* (2006.01)
*H01L 23/495* (2006.01)
*H01L 25/00* (2006.01)

(52) U.S. Cl.
CPC .... *H01L 23/4952* (2013.01); *H01L 23/49503* (2013.01); *H01L 23/49575* (2013.01); *H01L 25/50* (2013.01); H01L 2225/06506 (2013.01); H01L 2225/06562 (2013.01); H01L 2225/06582 (2013.01); H01L 2225/06593 (2013.01); H01L 2225/06596 (2013.01)

(58) Field of Classification Search
CPC ........... H01L 23/49503; H01L 23/4952; H01L 23/49575; H01L 25/50
See application file for complete search history.

(56) References Cited

U.S. PATENT DOCUMENTS

| | | | |
|---|---|---|---|
| 4,336,551 A | 6/1982 | Fujita et al. |
| 4,363,076 A | 12/1982 | McIver |
| 4,500,905 A | 2/1985 | Shibata |
| 4,706,166 A | 11/1987 | Go |
| 4,726,777 A | 2/1988 | Billman et al. |
| 4,784,972 A | 11/1988 | Hatada |
| 4,951,122 A | 8/1990 | Tsubosaki et al. |
| 4,967,262 A | 10/1990 | Farnsworth |
| 5,047,837 A | 9/1991 | Kitano et al. |
| 5,107,325 A | 4/1992 | Nakayoshi |
| 5,138,438 A | 8/1992 | Masayuki et al. |
| 5,200,362 A | 4/1993 | Lin et al. |
| 5,218,234 A | 6/1993 | Thompson et al. |
| 5,239,447 A | 8/1993 | Cotues et al. |
| 5,304,737 A | 4/1994 | Kim |
| 5,311,401 A | 5/1994 | Gates, Jr. et al. |
| 5,327,327 A | 7/1994 | Frew et al. |
| 5,331,591 A | 7/1994 | Clifton |
| 5,334,872 A | 8/1994 | Ueda et al. |
| 5,347,428 A | 9/1994 | Carson et al. |
| 5,365,106 A | 11/1994 | Watanabe |
| 5,434,745 A | 7/1995 | Shokrgozar et al. |
| 5,466,634 A | 11/1995 | Beilstein, Jr. et al. |
| 5,534,729 A | 7/1996 | Russell |
| 5,538,758 A | 7/1996 | Beach et al. |
| 5,571,754 A | 11/1996 | Bertin et al. |
| 5,592,019 A | 1/1997 | Ueda et al. |
| 5,616,953 A | 4/1997 | King et al. |
| 5,629,566 A | 5/1997 | Doi et al. |
| 5,675,180 A | 10/1997 | Pedersen et al. |
| 5,691,248 A | 11/1997 | Cronin et al. |
| 5,698,895 A | 12/1997 | Pedersen et al. |
| 5,716,759 A | 2/1998 | Badehi |
| 5,721,151 A | 2/1998 | Padmanabhan et al. |
| 5,731,631 A | 3/1998 | Yama et al. |
| 5,737,191 A | 4/1998 | Horiuchi et al. |
| 5,801,448 A | 9/1998 | Ball |
| 5,870,351 A | 2/1999 | Ladabaum et al. |
| 5,879,965 A | 3/1999 | Jiang et al. |
| 5,891,761 A | 4/1999 | Vindasius et al. |
| 5,910,687 A | 6/1999 | Chen et al. |
| 5,946,545 A | 8/1999 | Bertin et al. |
| 5,965,947 A | 10/1999 | Nam et al. |
| 6,005,776 A | 12/1999 | Holman et al. |
| 6,030,854 A | 2/2000 | Mashimoto et al. |
| 6,034,438 A | 3/2000 | Petersen |
| 6,071,139 A | 6/2000 | Corisis et al. |
| 6,087,716 A | 7/2000 | Ikeda |
| 6,088,237 A | 7/2000 | Farnworth et al. |
| 6,107,164 A | 8/2000 | Ohuchi |
| 6,175,158 B1 | 1/2001 | Degani et al. |
| 6,225,689 B1 | 5/2001 | Moden et al. |
| 6,228,686 B1 | 5/2001 | Smith et al. |
| 6,255,726 B1 | 7/2001 | Vindasius et al. |
| 6,262,476 B1 | 7/2001 | Vidal |
| 6,271,598 B1 | 8/2001 | Vindasius et al. |
| 6,297,657 B1 | 10/2001 | Thiessen et al. |
| 6,303,977 B1 | 10/2001 | Schroen et al. |
| 6,315,856 B1 | 11/2001 | Asagiri et al. |
| 6,320,253 B1 | 11/2001 | Kinsman et al. |
| 6,326,244 B1 | 12/2001 | Brooks et al. |
| 6,326,689 B1 | 12/2001 | Thomas |
| 6,338,980 B1 | 1/2002 | Satoh |
| 6,351,030 B2 | 2/2002 | Havens et al. |
| 6,418,033 B1 | 7/2002 | Rinne |
| 6,472,744 B1 | 10/2002 | Sato et al. |
| 6,472,746 B2 | 10/2002 | Taniguchi et al. |
| 6,473,291 B1 | 10/2002 | Stevenson |
| 6,476,467 B2 | 11/2002 | Nakamura et al. |
| 6,566,760 B1 | 5/2003 | Kawamura et al. |
| 6,569,709 B2 | 5/2003 | Derderian |
| D475,981 S | 6/2003 | Michii |
| 6,580,165 B1 | 6/2003 | Singh |
| 6,582,992 B2 | 6/2003 | Poo et al. |
| 6,593,648 B2 | 7/2003 | Emoto |
| 6,607,938 B2 | 8/2003 | Kwon et al. |
| 6,607,941 B2 | 8/2003 | Prabhu et al. |
| 6,621,155 B1 | 9/2003 | Perino et al. |
| 6,621,172 B2 | 9/2003 | Nakayama et al. |
| 6,624,505 B2 | 9/2003 | Badehi |
| 6,656,827 B1 | 12/2003 | Tsao et al. |
| 6,667,543 B1 | 12/2003 | Chow et al. |
| 6,670,701 B2 | 12/2003 | Matsuura et al. |
| 6,674,159 B1 | 1/2004 | Peterson et al. |
| 6,686,655 B2 | 2/2004 | Moden et al. |
| 6,706,971 B2 | 3/2004 | Albert et al. |
| 6,710,246 B1 | 3/2004 | Mostafazadeh et al. |
| 6,717,061 B2 | 4/2004 | Yamaguchi et al. |
| 6,722,213 B2 | 4/2004 | Offen et al. |
| 6,730,997 B2 | 5/2004 | Beyne et al. |
| 6,737,743 B2 | 5/2004 | Urakawa |
| 6,747,348 B2 | 6/2004 | Jeung et al. |
| 6,750,547 B2 | 6/2004 | Jeung et al. |
| 6,756,252 B2 | 6/2004 | Nakanishi |
| 6,777,767 B2 | 8/2004 | Badehi |
| 6,802,446 B2 | 10/2004 | Chaudhuri et al. |
| 6,844,623 B1 | 1/2005 | Peterson et al. |
| 6,849,802 B2 | 2/2005 | Song et al. |
| 6,853,557 B1 | 2/2005 | Haba et al. |
| 6,908,784 B1 | 6/2005 | Farnworth et al. |
| 6,910,268 B2 | 6/2005 | Miller |
| 6,940,022 B1 | 9/2005 | Vinciarelli et al. |
| 6,956,283 B1 | 10/2005 | Peterson |
| 6,964,915 B2 | 11/2005 | Farnworth et al. |
| 6,972,480 B2 | 12/2005 | Zilber et al. |
| 6,973,718 B2 | 12/2005 | Sheppard, Jr. et al. |
| 6,984,885 B1 | 1/2006 | Harada et al. |
| 7,005,324 B2 | 2/2006 | Imai |
| 7,029,949 B2 | 4/2006 | Farnworth et al. |
| 7,061,125 B2 | 6/2006 | Cho et al. |
| 7,115,986 B2 | 10/2006 | Moon et al. |
| 7,125,750 B2 | 10/2006 | Kwan et al. |
| 7,127,807 B2 | 10/2006 | Yamaguchi et al. |
| 7,180,168 B2 | 2/2007 | Imai |
| 7,190,060 B1 | 3/2007 | Chiang |
| 7,196,262 B2 | 3/2007 | Gronet |
| 7,208,335 B2 | 4/2007 | Boon et al. |
| 7,208,345 B2 | 4/2007 | Meyer et al. |
| 7,215,018 B2 | 5/2007 | Vindasius et al. |
| 7,221,051 B2 | 5/2007 | Ono et al. |
| 7,245,021 B2 | 7/2007 | Vindasius et al. |
| 7,259,455 B2 | 8/2007 | Seto |
| 7,279,363 B2 | 10/2007 | Cherukuri et al. |
| 7,285,865 B2 | 10/2007 | Kwon et al. |
| 7,335,533 B2 | 2/2008 | Derderian |
| 7,344,917 B2 | 3/2008 | Gautham |
| 7,355,274 B2 | 4/2008 | Lim |
| 7,402,911 B2 | 7/2008 | Thomas et al. |
| 7,405,138 B2 | 7/2008 | Ohuchi et al. |
| 7,408,243 B2 | 8/2008 | Shiffer |
| 7,429,782 B2 | 9/2008 | Brunnbauer et al. |
| 7,452,743 B2 | 11/2008 | Oliver et al. |
| 7,514,350 B2 | 4/2009 | Hashimoto |
| 7,521,288 B2 | 4/2009 | Arai et al. |

(56) References Cited

U.S. PATENT DOCUMENTS

| | | | |
|---|---|---|---|
| 7,535,109 B2 | 5/2009 | Robinson et al. | |
| 7,564,142 B2 | 7/2009 | Hashimoto | |
| 7,595,222 B2 | 9/2009 | Shimoishizaka et al. | |
| 7,601,039 B2 | 10/2009 | Eldridge et al. | |
| 7,638,869 B2 | 12/2009 | Irsigler et al. | |
| 7,662,670 B2 | 2/2010 | Noma et al. | |
| 7,662,671 B2 | 2/2010 | Saeki | |
| 7,704,794 B2 | 4/2010 | Mess et al. | |
| 7,732,912 B2 | 6/2010 | Damberg | |
| 7,768,795 B2 | 8/2010 | Sakurai et al. | |
| 7,829,438 B2 | 11/2010 | Haba et al. | |
| 7,829,990 B1 * | 11/2010 | Scanlan | H01L 23/3107 257/686 |
| 7,843,051 B2 * | 11/2010 | Song | H01L 25/105 257/685 |
| 7,863,159 B2 | 1/2011 | Co et al. | |
| 7,888,185 B2 | 2/2011 | Corisis et al. | |
| 7,901,989 B2 | 3/2011 | Haba et al. | |
| 7,919,846 B2 | 4/2011 | Hembree | |
| 7,923,349 B2 | 4/2011 | McElrea et al. | |
| 7,951,649 B2 | 5/2011 | Val | |
| 7,952,195 B2 | 5/2011 | Haba | |
| 8,022,527 B2 | 9/2011 | Haba et al. | |
| 8,040,682 B2 | 10/2011 | Shimoda | |
| 8,076,788 B2 | 12/2011 | Haba et al. | |
| 8,178,978 B2 * | 5/2012 | McElrea | H01L 24/24 257/676 |
| 8,373,280 B2 | 2/2013 | Harada et al. | |
| 8,390,109 B2 | 3/2013 | Popovic et al. | |
| 8,431,435 B2 | 4/2013 | Haba et al. | |
| 8,525,349 B2 * | 9/2013 | Song | H01L 22/32 257/686 |
| 8,551,815 B2 | 10/2013 | Avsian et al. | |
| 8,618,659 B2 | 12/2013 | Sato et al. | |
| 8,619,659 B2 | 12/2013 | Lee et al. | |
| 8,629,543 B2 | 1/2014 | McElrea et al. | |
| 8,633,576 B2 | 1/2014 | Zohni et al. | |
| 8,674,482 B2 | 3/2014 | Shi et al. | |
| 8,704,379 B2 | 4/2014 | Crane et al. | |
| 8,723,332 B2 | 5/2014 | McElrea et al. | |
| 8,772,920 B2 | 7/2014 | Thacker et al. | |
| 8,952,514 B2 | 2/2015 | Chun | |
| 9,082,634 B2 * | 7/2015 | Shin | H01L 25/0657 |
| 9,123,418 B2 | 9/2015 | Lin et al. | |
| 9,136,251 B2 | 9/2015 | Cheah et al. | |
| 9,490,195 B1 * | 11/2016 | Prabhu | H01L 23/49575 |
| 9,508,691 B1 | 11/2016 | Delacruz et al. | |
| 9,825,002 B2 * | 11/2017 | Katkar | H01L 25/0652 |
| 9,947,644 B2 * | 4/2018 | Hong | H01L 23/49816 |
| 2001/0012725 A1 | 8/2001 | Maeda et al. | |
| 2001/0031548 A1 | 10/2001 | Elenius et al. | |
| 2002/0006686 A1 | 1/2002 | Cloud et al. | |
| 2002/0027257 A1 | 3/2002 | Kinsman et al. | |
| 2002/0045290 A1 | 4/2002 | Ball | |
| 2002/0096349 A1 | 7/2002 | Hedler et al. | |
| 2002/0127775 A1 | 9/2002 | Haba et al. | |
| 2002/0168798 A1 | 11/2002 | Glenn et al. | |
| 2002/0180010 A1 | 12/2002 | Tsubosaki et al. | |
| 2002/0185725 A1 | 12/2002 | Moden et al. | |
| 2002/0187260 A1 | 12/2002 | Sheppard et al. | |
| 2002/0190368 A1 | 12/2002 | Shimoe et al. | |
| 2003/0038353 A1 | 2/2003 | Derderian | |
| 2003/0038356 A1 | 2/2003 | Derderian | |
| 2003/0038357 A1 | 2/2003 | Derderian | |
| 2003/0060034 A1 | 3/2003 | Beyne et al. | |
| 2003/0071338 A1 | 4/2003 | Jeung et al. | |
| 2003/0071341 A1 | 4/2003 | Jeung et al. | |
| 2003/0080403 A1 | 5/2003 | Jeung et al. | |
| 2003/0092326 A1 | 5/2003 | Nishikawa et al. | |
| 2003/0096454 A1 | 5/2003 | Poo et al. | |
| 2003/0099085 A1 | 5/2003 | Duva | |
| 2003/0122243 A1 | 7/2003 | Lee et al. | |
| 2003/0143819 A1 | 7/2003 | Hedler et al. | |
| 2003/0148597 A1 | 8/2003 | Tan et al. | |
| 2003/0162369 A1 | 8/2003 | Kobayashi | |
| 2003/0209772 A1 | 11/2003 | Prabhu | |
| 2004/0113283 A1 | 6/2004 | Farnworth et al. | |
| 2004/0142509 A1 | 7/2004 | Imai | |
| 2004/0150095 A1 | 8/2004 | Fraley et al. | |
| 2004/0173892 A1 | 9/2004 | Nakanishi | |
| 2004/0195667 A1 | 10/2004 | Karnezos | |
| 2004/0198033 A1 | 10/2004 | Lee et al. | |
| 2004/0212083 A1 | 10/2004 | Yang | |
| 2004/0217446 A1 | 11/2004 | Headley et al. | |
| 2004/0227235 A1 | 11/2004 | Hashimoto | |
| 2004/0238933 A1 | 12/2004 | Chen et al. | |
| 2004/0251520 A1 | 12/2004 | Sasaki et al. | |
| 2004/0262035 A1 | 12/2004 | Ko et al. | |
| 2005/0013927 A1 | 1/2005 | Yamazaki | |
| 2005/0067680 A1 | 3/2005 | Boon et al. | |
| 2005/0067694 A1 | 3/2005 | Pon et al. | |
| 2005/0082651 A1 | 4/2005 | Farnworth et al. | |
| 2005/0085050 A1 | 4/2005 | Draney et al. | |
| 2005/0101039 A1 | 5/2005 | Chen et al. | |
| 2005/0104179 A1 | 5/2005 | Zilber et al. | |
| 2005/0121758 A1 | 6/2005 | Di Stefano | |
| 2005/0135067 A1 | 6/2005 | Park et al. | |
| 2005/0148160 A1 | 7/2005 | Farnworth et al. | |
| 2005/0156323 A1 | 7/2005 | Tokunaga | |
| 2005/0230802 A1 | 10/2005 | Vindasius et al. | |
| 2005/0248021 A1 | 11/2005 | Morkner | |
| 2005/0258530 A1 | 11/2005 | Vindasius et al. | |
| 2005/0287705 A1 | 12/2005 | Yang | |
| 2005/0287709 A1 | 12/2005 | Lee et al. | |
| 2006/0003552 A1 | 1/2006 | Okada | |
| 2006/0035408 A1 | 2/2006 | Derderian | |
| 2006/0046436 A1 | 3/2006 | Ohuchi et al. | |
| 2006/0055050 A1 | 3/2006 | Numata et al. | |
| 2006/0068567 A1 | 3/2006 | Beyne et al. | |
| 2006/0076690 A1 | 4/2006 | Khandros et al. | |
| 2006/0094165 A1 | 5/2006 | Hedler et al. | |
| 2006/0097356 A1 | 5/2006 | Fujii et al. | |
| 2006/0103000 A1 | 5/2006 | Kurosawa | |
| 2006/0121645 A1 | 6/2006 | Ball | |
| 2006/0138626 A1 | 6/2006 | Liew et al. | |
| 2006/0220262 A1 | 10/2006 | Meyer et al. | |
| 2006/0233012 A1 | 10/2006 | Sekiguchi et al. | |
| 2006/0252180 A1 | 11/2006 | Moden et al. | |
| 2006/0267173 A1 | 11/2006 | Takiar et al. | |
| 2006/0273365 A1 | 12/2006 | Cross et al. | |
| 2006/0278971 A1 | 12/2006 | Barnes et al. | |
| 2007/0023900 A1 | 2/2007 | Toyoda | |
| 2007/0029684 A1 | 2/2007 | Arai et al. | |
| 2007/0065987 A1 | 3/2007 | Mess et al. | |
| 2007/0102801 A1 | 5/2007 | Ishida et al. | |
| 2007/0132082 A1 | 6/2007 | Tang et al. | |
| 2007/0158799 A1 | 7/2007 | Chiu et al. | |
| 2007/0158807 A1 | 7/2007 | Lu et al. | |
| 2007/0170572 A1 | 7/2007 | Liu et al. | |
| 2007/0181989 A1 | 8/2007 | Corisis et al. | |
| 2007/0187811 A1 | 8/2007 | Arai et al. | |
| 2007/0194462 A1 | 8/2007 | Kim et al. | |
| 2007/0222054 A1 | 9/2007 | Hembree | |
| 2007/0252262 A1 | 11/2007 | Robinson et al. | |
| 2007/0284716 A1 | 12/2007 | Vindasius et al. | |
| 2007/0290333 A1 | 12/2007 | Saini et al. | |
| 2008/0029866 A1 | 2/2008 | Kim et al. | |
| 2008/0029884 A1 | 2/2008 | Grafe et al. | |
| 2008/0083976 A1 | 4/2008 | Haba et al. | |
| 2008/0083977 A1 | 4/2008 | Haba et al. | |
| 2008/0094086 A1 | 4/2008 | Kim | |
| 2008/0112150 A1 | 5/2008 | Jones | |
| 2008/0150158 A1 | 6/2008 | Chin | |
| 2008/0166836 A1 | 7/2008 | Jobetto | |
| 2008/0173792 A1 | 7/2008 | Yang et al. | |
| 2008/0180242 A1 | 7/2008 | Cottingham | |
| 2008/0203566 A1 | 8/2008 | Su | |
| 2008/0206915 A1 | 8/2008 | Yamazaki | |
| 2008/0208043 A1 | 8/2008 | Smith et al. | |
| 2008/0251913 A1 | 10/2008 | Inomata | |
| 2008/0251939 A1 | 10/2008 | Chung et al. | |
| 2008/0284044 A1 | 11/2008 | Myers | |
| 2008/0290493 A1 | 11/2008 | Tsunozaki | |
| 2008/0303131 A1 | 12/2008 | McElrea et al. | |

(56) References Cited

U.S. PATENT DOCUMENTS

| | | |
|---|---|---|
| 2008/0308921 A1 | 12/2008 | Kim |
| 2008/0315407 A1 | 12/2008 | Andrews, Jr. et al. |
| 2009/0020887 A1 | 1/2009 | Mizuno et al. |
| 2009/0020889 A1 | 1/2009 | Murayama et al. |
| 2009/0045524 A1 | 2/2009 | Mohammed et al. |
| 2009/0065948 A1 | 3/2009 | Wang |
| 2009/0068790 A1 | 3/2009 | Caskey et al. |
| 2009/0085184 A1* | 4/2009 | Song .................. H01L 25/105 257/686 |
| 2009/0102038 A1 | 4/2009 | McElrea et al. |
| 2009/0127689 A1 | 5/2009 | Ye et al. |
| 2009/0146137 A1 | 6/2009 | Kim et al. |
| 2009/0160065 A1 | 6/2009 | Haba et al. |
| 2009/0209061 A1 | 8/2009 | Jeong |
| 2009/0212410 A1 | 8/2009 | Wu et al. |
| 2009/0230528 A1 | 9/2009 | McElrea et al. |
| 2009/0316378 A1 | 12/2009 | Haba et al. |
| 2010/0140753 A1 | 6/2010 | Hembree |
| 2010/0140811 A1 | 6/2010 | Leal et al. |
| 2010/0148352 A1 | 6/2010 | Moden |
| 2010/0207277 A1 | 8/2010 | Bauer et al. |
| 2010/0327461 A1 | 12/2010 | Co et al. |
| 2011/0006432 A1 | 1/2011 | Haba et al. |
| 2011/0031629 A1 | 2/2011 | Haba et al. |
| 2011/0033979 A1 | 2/2011 | Haba et al. |
| 2011/0049696 A1 | 3/2011 | Haba et al. |
| 2011/0169154 A1 | 7/2011 | Kweon et al. |
| 2011/0187007 A1 | 8/2011 | Haba et al. |
| 2011/0248410 A1 | 10/2011 | Avsian et al. |
| 2011/0266684 A1 | 11/2011 | Leal |
| 2012/0025396 A1 | 2/2012 | Liao et al. |
| 2012/0049376 A1 | 3/2012 | Harada et al. |
| 2012/0051695 A1 | 3/2012 | Harada et al. |
| 2012/0056327 A1 | 3/2012 | Harada et al. |
| 2012/0061846 A1 | 3/2012 | Rathburn |
| 2012/0080807 A1 | 4/2012 | Haba et al. |
| 2012/0133057 A1 | 5/2012 | Haba et al. |
| 2012/0211878 A1 | 8/2012 | Popovic et al. |
| 2012/0280386 A1 | 11/2012 | Sato et al. |
| 2012/0286411 A1* | 11/2012 | Watanabe .............. H01L 21/561 257/676 |
| 2012/0313264 A1 | 12/2012 | Sato et al. |
| 2013/0001757 A1* | 1/2013 | Chia .................. H01L 23/4334 257/675 |
| 2013/0083583 A1 | 4/2013 | Crisp et al. |
| 2013/0099392 A1 | 4/2013 | McElrea et al. |
| 2013/0099393 A1 | 4/2013 | Jeong et al. |
| 2013/0119542 A1 | 5/2013 | Oh |
| 2013/0154117 A1 | 6/2013 | Tan et al. |
| 2013/0286707 A1 | 10/2013 | Crisp et al. |
| 2013/0299977 A1 | 11/2013 | Dayringer et al. |
| 2013/0323885 A1* | 12/2013 | Chun .................. H01L 21/56 438/123 |
| 2013/0336039 A1 | 12/2013 | Frans |
| 2013/0341803 A1 | 12/2013 | Cheah et al. |
| 2014/0070423 A1 | 3/2014 | Woychik et al. |
| 2014/0097526 A1 | 4/2014 | Suleiman et al. |
| 2014/0104786 A1 | 4/2014 | Clayton et al. |
| 2014/0264945 A1 | 9/2014 | Yap et al. |
| 2015/0098677 A1 | 4/2015 | Thacker et al. |
| 2015/0200181 A1 | 7/2015 | Haga et al. |
| 2016/0035698 A1 | 2/2016 | Lee et al. |
| 2016/0141232 A1 | 5/2016 | Cannon |
| 2017/0018485 A1 | 1/2017 | Prabhu et al. |

FOREIGN PATENT DOCUMENTS

| | | |
|---|---|---|
| CN | 1638118 A | 7/2005 |
| CN | 1905148 A | 1/2007 |
| CN | 104332462 A | 2/2015 |
| DE | 102004039906 A1 | 8/2005 |
| EP | 1041624 A1 | 10/2000 |
| EP | 1763894 A2 | 3/2007 |
| EP | 2650880 A1 | 10/2013 |
| FR | 2704690 A1 | 11/1994 |
| JP | 07-509104 A | 10/1995 |
| JP | 11-260851 A | 9/1999 |
| JP | 2000269411 A | 9/2000 |
| JP | 2001210782 A | 8/2001 |
| JP | 2003-142518 A | 5/2003 |
| JP | 2003163324 A | 6/2003 |
| JP | 2004047702 A | 2/2004 |
| JP | 2004-119473 | 4/2004 |
| JP | 2004153130 A | 5/2004 |
| JP | 2004158536 A | 6/2004 |
| JP | 2004-214548 A | 7/2004 |
| JP | 2005005529 A | 1/2005 |
| JP | 2005026564 A | 1/2005 |
| JP | 2006-351793 A | 12/2006 |
| JP | 2007073803 A | 3/2007 |
| JP | 2007523482 A | 8/2007 |
| JP | 2008160119 A | 7/2008 |
| JP | 2008205453 A | 9/2008 |
| JP | 2008236688 A | 10/2008 |
| JP | 2009-026969 | 2/2009 |
| JP | 2009027039 A | 2/2009 |
| KR | 20-1994-0004952 | 7/1994 |
| KR | 10-1999-0008537 | 2/1999 |
| KR | 20010062722 A | 7/2001 |
| KR | 20050009036 A | 1/2005 |
| KR | 20070018057 A | 2/2007 |
| KR | 100813624 B1 | 3/2008 |
| KR | 20080045259 A | 5/2008 |
| KR | 20080069549 A | 7/2008 |
| KR | 20080091980 | 10/2008 |
| KR | 20140086417 A | 7/2014 |
| NO | 2010057339 A1 | 5/2010 |
| TW | 475244 | 2/2002 |
| TW | 200425356 A | 11/2004 |
| TW | 200504995 A | 2/2005 |
| TW | 200527549 A | 8/2005 |
| TW | 200605298 A | 2/2006 |
| TW | 200721471 | 6/2007 |
| TW | 200913208 A | 3/2009 |
| TW | 200940570 A | 10/2009 |
| WO | 9425987 A1 | 11/1994 |
| WO | 9907015 A1 | 2/1999 |
| WO | 9909599 A2 | 2/1999 |
| WO | 0164344 A2 | 9/2001 |
| WO | 2005081315 A2 | 9/2005 |
| WO | 2005101492 A2 | 10/2005 |
| WO | 2009032371 A1 | 3/2009 |
| WO | 2009052150 A1 | 4/2009 |
| WO | 2009114670 A2 | 9/2009 |

OTHER PUBLICATIONS

Kong, J., et al., Sensitivity Study of Channel Termination on Vertical Side-Chip Interconnection, Universiti Sains Malaysia, 35th International Electronic Manufacturing Technology Conference, 2012.

Han, Sang Wook, Wireless Interconnect using Inductive Coupling in 3D-ICs, University of Michigan, 2012.

U.S. Appl. No. 14/883,864 dated Oct. 15, 2015.

International Search Report for Application No. PCT/US2016/062304 dated Mar. 6, 2017.

International Search Report for Application No. PCT/US2017/026444 dated Jul. 21, 2017.

* cited by examiner

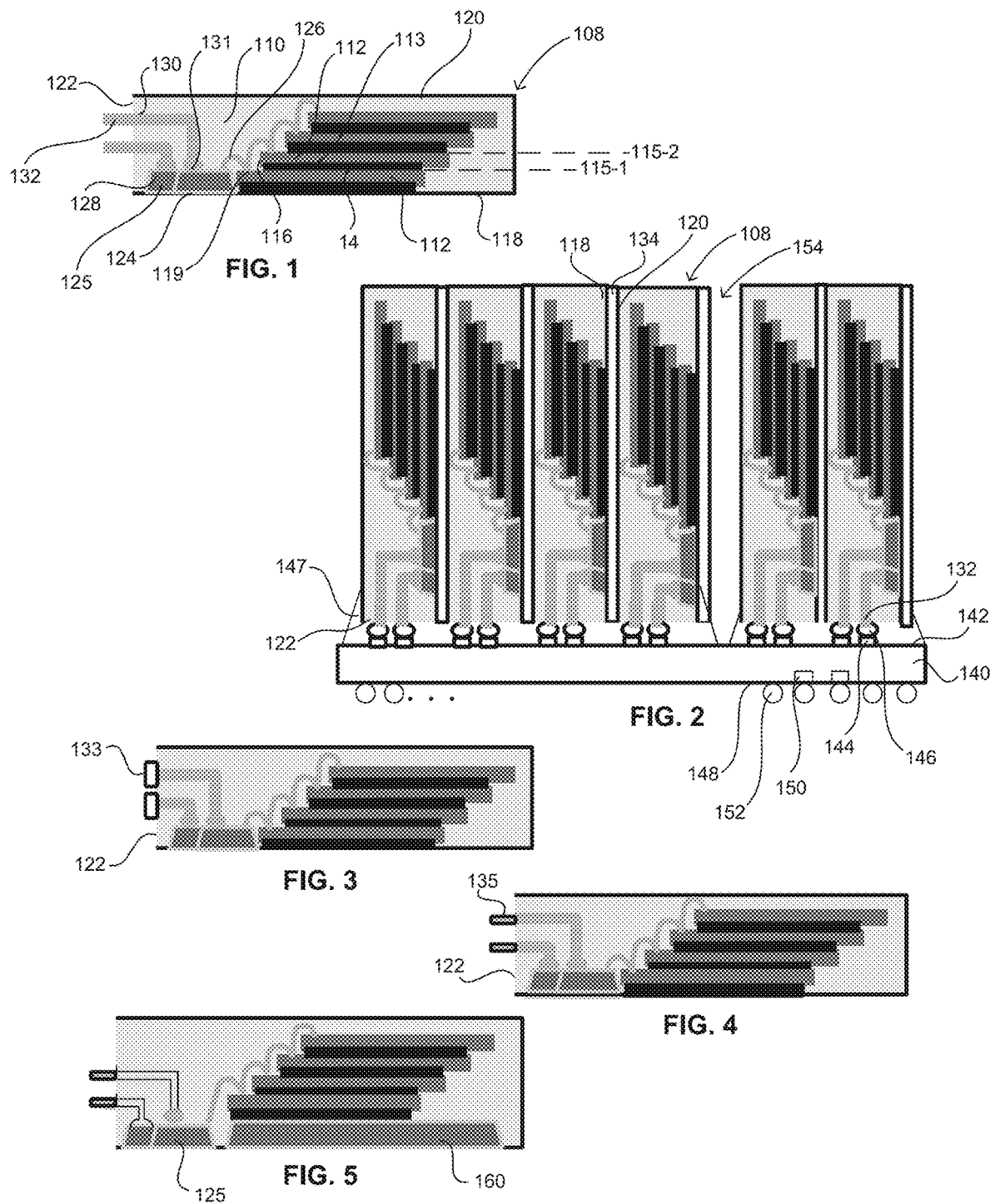

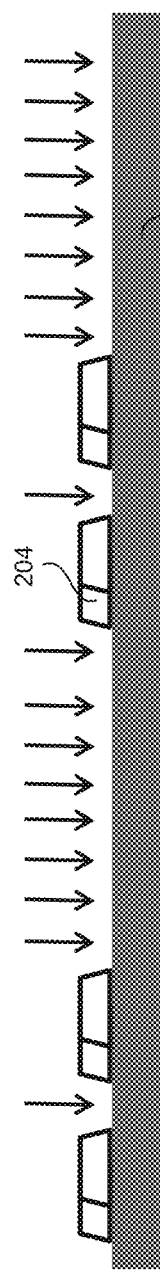
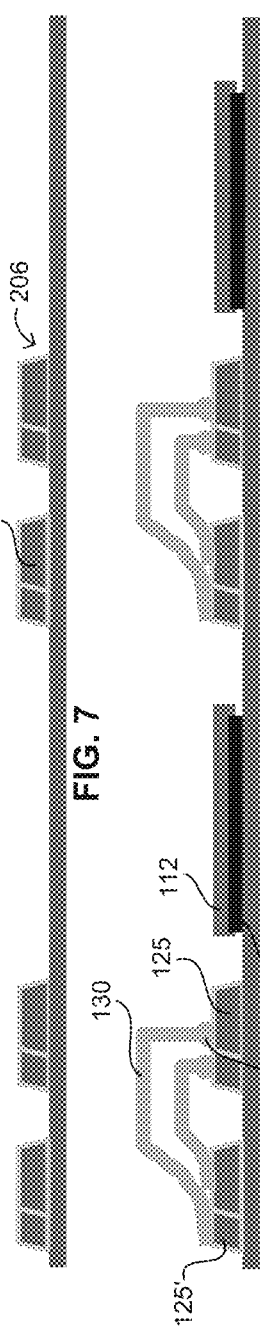
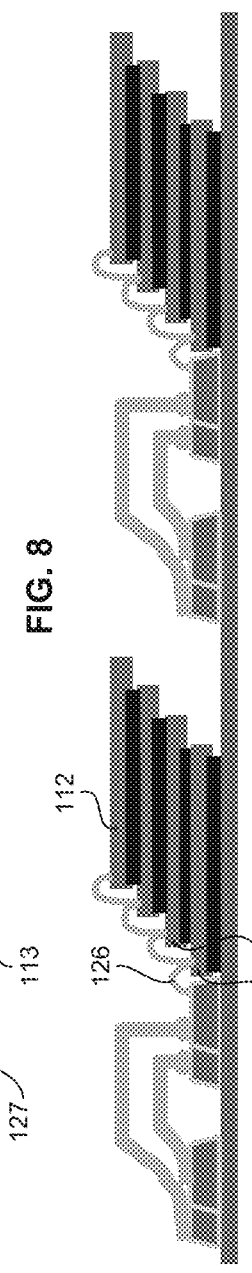
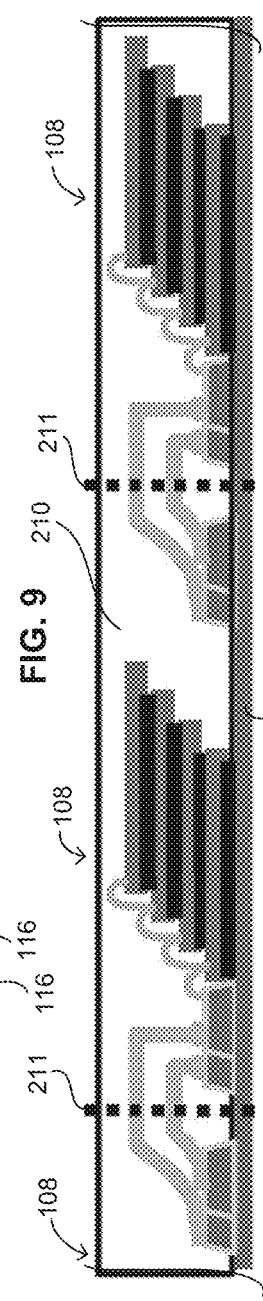
FIG. 6 FIG. 7 FIG. 8 FIG. 9 FIG. 10

MICROELECTRONIC PACKAGES HAVING STACKED DIE AND WIRE BOND INTERCONNECTS

BACKGROUND

Technical Field

The subject matter of this application relates to microelectronic packages and assemblies in which a plurality of semiconductor chips are stacked one above the other and electrically interconnected with a support element such as a package element or other circuit panel.

Description of the Related Art

Semiconductor die or chips are flat bodies with contacts disposed on the front surface that are connected to the internal electrical circuitry of the chip itself. Semiconductor chips are typically packaged with substrates to form microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer or a cell phone.

Microelectronic packages can include wafer level packages, which provide a package for a semiconductor component that is fabricated while the chips are still in a wafer form. The wafer is subjected to a number of additional process steps to form the package structure and the wafer is then diced to free the individual die or chips. Wafer level processing may provide a cost savings advantage. Furthermore, fan-out wafer-level packages can be fabricated by encapsulating edges of an array of semiconductor chips within a reconstituted wafer, and then performing additional processing to form fan-out traces and contacts.

In order to save space certain conventional designs have stacked multiple microelectronic elements or semiconductor chips within a package. This allows the package to occupy a surface area on a substrate that is less than the total surface area of the chips in the stack. However, conventional stacked packages have disadvantages of complexity, cost, thickness and testability.

In spite of the above advances, there remains a need for improved stacked packages and especially stacked chip packages which incorporate multiple chips for certain types of memory, e.g., flash memory. There is a need for such packages which are reliable, thin, testable and that are economical to manufacture.

BRIEF DESCRIPTION OF THE SEVERAL VIEWS OF THE DRAWINGS

FIG. 1 is a sectional view depicting a microelectronic package in accordance with an embodiment disclosed herein.

FIG. 2 is a sectional view depicting a microelectronic assembly in accordance with an embodiment disclosed herein.

FIG. 3 is a sectional view depicting a microelectronic package in accordance with a variation of an embodiment disclosed herein.

FIG. 4 is a sectional view depicting a microelectronic package in accordance with a variation of an embodiment disclosed herein.

FIG. 5 is a sectional view depicting a microelectronic package in accordance with a variation of an embodiment disclosed herein.

FIGS. 6, 7, 8, 9, and 10 are sectional views depicting respective stages in a process of fabricating a microelectronic package in accordance with an embodiment disclosed herein.

DETAILED DESCRIPTION

Figure 11:
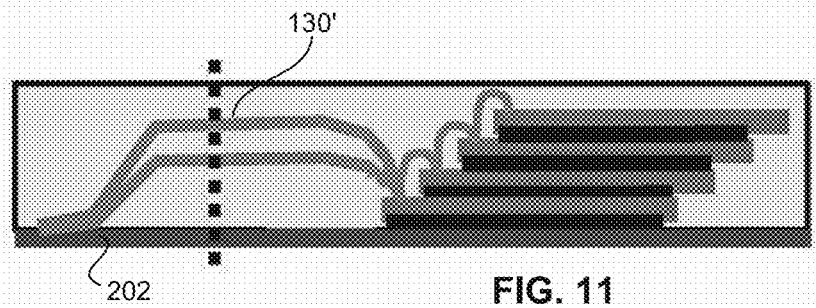
FIG. 11 is a sectional view depicting a stage in a process of fabricating a microelectronic package in accordance with an embodiment disclosed herein

A microelectronic package in accordance with an embodiment disclosed herein includes at least one microelectronic element having a front surface defining a plane, and the plane of each microelectronic element may be parallel to the plane of any other microelectronic element. An encapsulation region overlying edge surfaces of each microelectronic element may have first and second major surfaces substantially parallel to the plane of each microelectronic element and peripheral surfaces between the major surfaces. Wire bonds may be electrically coupled with one or more first package contacts at the first major surface of the encapsulation region, each wire bond having a portion contacted and surrounded by the encapsulation region. Second package contacts at an interconnect surface which can be one or more of the second major surface and the peripheral surfaces can include portions of the wire bonds at such surface, and/or electrically conductive structure electrically coupled with the wire bonds.

A microelectronic assembly in accordance with an embodiment disclosed herein may include a substrate having first and second opposite surfaces and substrate contacts at the first surface thereof. First and second microelectronic packages have contacts which face and are electrically coupled with the substrate contacts. The first and second microelectronic packages may be assembled with one another such that a major surface of the first microelectronic package faces a major surface of the second microelectronic package. Each microelectronic package comprises at least one microelectronic element, wherein each microelectronic element has a front surface defining a plane, a plurality of element contacts at the front surface and a plurality of edge surfaces extending away from the plane. The plane of each microelectronic element may be parallel to the plane of any other microelectronic element of each package. An encapsulation region overlies the edge surfaces of each microelectronic element, and has first and second major surfaces and peripheral surfaces extending between the major surfaces. The first and second major surfaces may be substantially parallel to the plane of each microelectronic element. Wire bonds may be electrically coupled with the at least one microelectronic element, each wire bond having a portion contacted and surrounded by the encapsulation region. The package may include second package contacts at the first peripheral surface which comprise portions of the wire bonds at the first peripheral surface, and/or electrically conductive structure coupled with the wire bonds.

A method of making a microelectronic package in accordance with an embodiment disclosed herein may include stacking a plurality of microelectronic elements, wherein each microelectronic element has a front surface defining a plane, a plurality of contacts at the front surface and a plurality of edge surfaces extending away from the plane, the microelectronic elements stacked with the planes parallel to one another. Each microelectronic element may be electrically interconnected with first package contacts. Such method may further include forming wire bonds electrically coupled to the first package contacts, wherein the wire bonds extend in a direction away from the first package contacts; and forming an encapsulation region overlying the edge surfaces. The encapsulation region may have first and second major surfaces and peripheral surfaces between the major surfaces, and the first and second major surfaces may be substantially parallel to the planes of the microelectronic elements. The method can be performed such that electrically conductive second package contacts are at an interconnect surface being one or more of a major surface or one or more peripheral surface of the encapsulation region, the second package contacts electrically coupled with the first package contacts through the wire bonds.

In accordance with one or more embodiments disclosed herein, microelectronic packages and assemblies which include microelectronic packages as disclosed herein may be configured to provide enhanced storage density which can be especially advantageously provided in systems used in data centers, among which include enterprise systems, government systems, hosted systems, search engine systems, cloud storage, or other large-scale data centers.

As used in this disclosure with reference to a dielectric region or other electrically insulating structure of a component, e.g., an encapsulation region, circuit structure, interposer, microelectronic element, capacitor, voltage regulator, circuit panel, substrate, etc., a statement that an electrically conductive element is "at" a surface of the dielectric region or structure indicates that, when the surface is not covered or assembled with any other element, the electrically conductive element is available for contact with a theoretical point moving in a direction perpendicular to that surface of the dielectric region from outside the dielectric region. Thus, a terminal, package contact, or other conductive element which is at a surface of a dielectric region may project from such surface; may be flush with such surface; or may be recessed relative to such surface in a hole or depression in the dielectric region.

FIG. 1 illustrates a microelectronic package 108, each microelectronic package including at least one microelectronic element 112. Each microelectronic element may be a semiconductor chip having an integrated circuit thereon, or other integrated circuit device having a plurality of active devices thereon. In one example, each microelectronic element may be a semiconductor chip or other integrated circuit device with one or more additional layers of circuitry formed thereon.

In one example, each of the microelectronic elements in a microelectronic package 108 may include one or more memory storage arrays, which may include a particular memory type such as nonvolatile memory. Nonvolatile memory can be implemented in a variety of technologies some of which include memory cells that incorporate floating gates, such as, for example, flash memory, and others which include memory cells which operate based on magnetic polarities. Flash memory chips are currently in widespread use as solid state storage as an alternative to magnetic fixed disk drives for computing and mobile devices. Flash memory chips are also commonly used in portable and readily interchangeable memory drives and cards, such as Universal Serial Bus (USB) memory drives, and memory cards such as Secure Digital or SD cards, microSD cards (trademarks or registered trademarks of SD-3C), compact flash or CF cards and the like. Flash memory chips typically have NAND or NOR type devices therein; NAND type devices are common. Other examples of semiconductor chips 112 may also include one or more DRAM, NOR, microprocessor, controller die, etc. or combinations thereof. In one embodiment, a microelectronic element may have a greater number of active devices for providing memory storage array function than for any other function. Each semiconductor chip may be implemented in one of various semiconductor materials such as silicon, germanium, and gallium arsenide or one or more other Group III-V semiconductor compounds or Group II-VI semiconductor compounds, etc. In certain cases, the microelectronic elements 112 in one or more packages 108 may be a combination of different chip functionalities as described above and a combination of various semiconductor materials as described above.

Each microelectronic element has a front surface 114 and a plurality of edge surfaces 116 extending away from the front surface of such microelectronic element. In cases where there is more than one microelectronic element, the microelectronic elements are stacked one above another such that front faces 114 of the microelectronic elements define respective planes, e.g., planes 115-1, 115-2 which are parallel to one another, wherein a microelectronic element higher in the stack at least partially overlies another microelectronic element in the stack, each microelectronic element typically attached to the microelectronic element just beneath it through an adhesive 113. FIG. 1 illustrates microelectronic elements arranged in an offset stack configuration, wherein the edge surfaces 116 of adjacent microelectronic elements in the stack are horizontally offset from one another. In a variation thereof, the microelectronic elements can be arranged such that the edge surfaces 116 are aligned with one another in horizontal directions parallel to the first major surface 118 of the microelectronic package.

Although the front surfaces 114 of each of the chips in the package stack are shown all oriented in the same direction in FIG. 1, the front surfaces of one or more of the chips in the package stack can be oriented in the opposite direction such that the front surfaces of at least two of the chips which are adjacent one another would either face each other or would face in opposite directions away from one another.

Each package may include a plurality of electrically conductive first package contacts 124 at a first major surface 118 of the package, the first major surface being substantially parallel to a plane defined by the front surface at least one of the microelectronic elements 112, for example, plane 115-1. When present, the first package contacts 124 are configured for electrically connecting the microelectronic package 108 with another component. In one example, the first package contacts are configured for connecting a set of contacts at a major surface of another microelectronic package which are juxtaposed with the first package contacts 124 when the first major surface is arranged in a confronting relationship with a major surface of the another microelectronic package.

In some cases, the first package contacts 124 can be surfaces of metal leadframe interconnects which are electrically coupled to one or more microelectronic elements 112 such as through electrically conductive structure 126 as shown in FIG. 1. As seen in FIG. 1, each first package contact 124 can be electrically coupled with a chip contact 119 at a front surface of a microelectronic element through electrically conductive structure 126 extending above the front surface 114 of the at least one microelectronic element. In one example, the electrically conductive structure is or includes at least one wire bond. In another example, the electrically conductive structure can be a trace of electrically conductive material. Thus, in one example, traces of a flowable electrically conductive polymeric material or an electrically conductive ink such as an electrically conductive material in a carrier can be deposited and then allowed or conditioned to cure, harden or dry to provide the electrically conductive trace, Alternatively or in addition thereto, a metal can be plated onto the first package contacts and/or onto the chip contacts 119, such as by one or more of electroless or electrolytic plating, to contribute to the formation of the electrically conductive structure. In a particular case, the electrically conductive structure can include an electrically conductive trace of material contacting the contacts 119 on the at least one microelectronic element, such trace electrically coupled with the first package contacts. For example, electrically conductive traces can be formed by depositing drops, droplets or lines of electrically conductive polymer material or electrically conductive ink. In another example, traces can be formed alternatively by blanket depositing such material onto a surface that overlies or coincides with the at least one microelectronic element, and then removing the material between laterally adjacent contacts on the same microelectronic element 108, and removing the electrically conductive material between adjacent first package contacts 124 at the first major surface 118 of the microelectronic package 108.

In the example seen in FIG. 1, each microelectronic package 108 comprises an encapsulation region 110 that overlies the edge surfaces 116 of the at least one microelectronic element, one or more surfaces of the leadframe elements, and the electrically conductive structure 126. The encapsulation region can be as described, for example, in U.S. Pat. No. 8,618,659, incorporated by reference herein. The encapsulation region has first and second major surfaces 118, 120 which are substantially parallel to one another and to at least one plane defined by the front surface of the at least one microelectronic elements in the package 108. The encapsulation region 110 may typically comprise one or more layers of dielectric material which can be made of an encapsulant or potting compound. In some examples, the encapsulation region is formed by introducing a flowable encapsulant material into a mold surrounding the microelectronic elements and associated circuitry and package contacts coupled thereto, then allowing or causing the encapsulant to harden into the encapsulation region. In some examples, the encapsulation region is formed of a dielectric material into which particles of dielectric or semiconductor material have been added, such as glass, silicon dioxide or silicon, for example, wherein the added particles reinforce the encapsulation region or may reduce an effective coefficient of thermal expansion associated with the encapsulation region. Alternatively or in addition thereto, the encapsulation region may include one or more layers of an adhesive or other dielectric material. In a particular example thereof, the encapsulation region 110 may include one or more layers of epoxy, elastomer, polyimide or other polymeric material.

In one example, as seen in FIG. 1, a plurality of wire bonds 130 extend from bond surfaces 128 of respective electrically conductive elements 125 of the package. For example, the wire bonds can be similar to the wire bonds provided in a bond via array ("BVA") technology arrangement disclosed, for example, in connection with FIG. 7 of commonly owned U.S. Pat. No. 8,618,659, incorporated by reference herein. The electrically conductive elements in some cases can be leadframe elements which also have surfaces at the first major surface 118 which function as the first package contacts 124. Each wire bond is formed from a length of extruded metal wire which is metallurgically joined at a base 131 of the wire bond 130 to the bond surface 128 of the electrically conductive element. For example, a capillary bonding tool or a wedge bonding tool can be used to metallurgically bond a length of a metal wire of copper, nickel, gold, or aluminum, for example, to the bond surface of the electrically conductive element 125, as will be described more fully below. A thickness or diameter of each wire can range from 5 to 100 microns. Thicknesses of extruded metal wire common for use with popular wire bonding tools include thicknesses ranging from 17 microns to 100 microns. In a particular example, a wire bond may not be formed directly on a leadframe element or directly on a patterned portion of a metal sheet. For example, an additional stud bump or metal ball formed by a wire bonding tool may be present atop the bond surface 128. A metallization, e.g., barrier layer and/or adhesion layer may be present atop the bond surface 128, on which the wire bond or other electrically conductive structure can be provided.

Each wire bond has a first portion contacted and surrounded by the encapsulation region 110, and has an unencapsulated second portion at an interconnect surface of the encapsulation region. The unencapsulated second portion of a wire bond is defined by at least one of an end surface of such wire bond or by an edge surface of such wire bond which is not fully covered by the encapsulant material and which is "at" the interconnect surface in accordance with the definition thereof provided herein. In the example shown in FIG. 1, an interconnect surface is a peripheral surface 122 of the encapsulation region, or the interconnect surface is associated with such peripheral surface. In the example of FIG. 1, second portions of the wire bonds 130 are shown projecting above the peripheral surface 122. In other examples, portions of the wire bonds may be "at" the interconnect surface in that such portions may be flush with the interconnect surface, or recessed relative to the interconnect surface in one or more holes or depressions therein, as is consistent with the definition of "at" provided herein. In a particular example, the second portions define second package contacts 132 of the microelectronic package 108 which are usable to, i.e., configured for connecting the package with respective contacts of another electrical component. Stated another way, the second package contacts can comprise the second portions of the wire bonds which are at the interconnect surface of the package.

In one example as seen in FIG. 2, a microelectronic assembly 100 comprises a plurality of the microelectronic packages 108 stacked with one another such that a major surface 118 or 120 of each package faces a major surface 118, 120 of the package 108 adjacent to such package in the stack. Adjacent packages 108 in the stack can be attached to one another through an adhesive layer 134 between confronting major surfaces of the packages. In one example, the packages 108 are arranged such that a first major surface 118 of a package 108 in the stack faces the second major surface 120 of the package 108 in the stack adjacent thereto, and this arrangement can be used throughout the stack. However, in another example, in some cases the stack may include some packages in which the first major surfaces 118 of adjacent packages in the stack face one another, and/or may include some packages in which the second major surfaces 120 of adjacent packages face one another.

As shown in FIG. 2, the microelectronic assembly may further comprise a substrate 140, wherein the stack of microelectronic packages 108 can be oriented with the interconnect surfaces of the packages 108, i.e., the peripheral surfaces 122, facing towards a surface 142 of a substrate 140. The substrate 140 may be a dielectric element or other substrate and which may have one or multiple layers of dielectric material and one or multiple electrically conductive layers thereon. The substrate 140 can be formed of various materials, which may or may not include a polymeric component, and may or may not include an inorganic component. Alternatively, the substrate may be wholly or essentially polymeric or may be wholly or essentially inorganic. In various non-limiting examples, the support element can be formed of a composite material such as glass-reinforced epoxy, e.g., FR-4, or can be formed of one or more of a semiconductor material, e.g., Si or GaAs among others, a glass or ceramic material.

In the example depicted in FIG. 2, the substrate can be one that has contacts or terminals at a lower surface facing away from the microelectronic assemblies, the contacts configured for surface mounting to another component which can be a card, tray, motherboard, etc., such as via a land grid array (LGA), ball grid array (BGA), or other technique. In another example, the substrate can be a card component having slide contacts on top and bottom surfaces thereof, such as for insertion into a socket. In yet another example, another component such as universal serial bus (USB) controller or other communications controller can be mounted to the substrate and electrically coupled with the microelectronic assembly, such component assisting in or controlling a flow of information between the microelectronic assembly and a system.

The substrate may include a plurality of substrate contacts 144 at a first surface 142 of the substrate which faces the peripheral surfaces 122 of the packages. The substrate contacts 144 may face and be electrically coupled with respective second package contacts 132 of each package 108 via masses 146 of bond material. In one example, the bond material can be in form of electrically conductive bumps such as masses of solder, tin, indium or eutectic material, or drops or droplets of electrically conductive polymer material or electrically conductive ink on surfaces of the substrate contacts 144 and contacting the second package contacts 132.

The bond material may be applied to the second package contacts 132 or the substrate contacts 144 through a transfer mold of solder bumps, balls or features, or application of solder balls, for example, or may alternatively be deposited on the substrate contacts by plating or depositing a metal or other conductive material. Alternatively, the electrically bond material can be applied by depositing an electrically conductive ink or paste or an electrically conductive polymer material onto an exposed surface of the substrate contacts 144.

At a second surface 148 of the substrate opposite from the first surface 142, a plurality of terminals 150 can be provided for electrically coupling the microelectronic assembly in a system, e.g., such as to a circuit board or other component. In a particular example, joining elements 152 such as solder balls may be attached to the terminals and which may be reflowed to form the electrical connections with the external component. In some cases, an underfill 147 can be introduced between the peripheral surfaces of the packages 108 and the first surface 142 of the substrate to further mechanically reinforce the structure and connections between the packages 108 and the substrate.

As further seen in FIG. 2, a gap 154 can be provided between adjacent packages in the stack. In some cases, the gap can be used to permit circulation of air or a coolant between the adjacent packages. In one example, a heat spreader can be disposed in the gap; in another example, a cold plate having an active cooling function can be disposed in the gap. Thus, the microelectronic assembly provides extraordinary capabilities for electrically interconnecting a large number of memory storage array microelectronic elements in a system, such as for a purpose of increasing a memory storage capacity or an active memory capacity of the system.

Referring now to FIG. 3, in one variation, the second package contacts 133 of a package may be provided as electrically conductive structure at the peripheral surface 122 which is electrically coupled with the wire bonds. For example, the second package contacts 133 can be electrically conductive features attached or formed by depositing conductive material in contact with the wire bonds. In particular examples, the second package contacts 133 may be formed by metal plating, stencil or screen printing or dispensing techniques, or stud bumping techniques. In one example, such techniques can be applied to form the second package contacts 133 after the peripheral surface 122 of the encapsulation region is defined. Alternatively, electrically conductive structure can be applied prior to one or more operations which defines the peripheral surface 122. FIG. 4 further shows an example in which the second portions of the wire bonds project beyond the peripheral surface 122 and are coated with a diffusion-resistant metal 135 such as palladium. The coated projecting portions may define the second package contacts in that case. The metal coating can protect the projecting portions of the wire bonds from intermetallic diffusion in a state in which the coated portions of the wire bonds are coupled to other elements through a solder or other bond metal. Alternatively, the wire bonds can be formed from metal wire which has been pre-coated with the diffusion resistant metal.

FIG. 5 illustrates yet another example in which the stack of microelectronic elements is attached to an underlying metal die attach pad 160. In one example, the metal die attach pad 160 is a portion of a leadframe of which conductive elements 125 are also portions. The die attach pad 160 can serve as a thermally conductive element to help transfer heat away from the package when used in a system such as seen in FIG. 2. Alternatively or in addition thereto, the die attach pad can function as a ground or power plane for the package, to which the at least one microelectronic element in the package can be electrically coupled, e.g., through wire bonds.

Referring now to FIGS. 6-10, a method is illustrated for fabricating the microelectronic package 108 shown in FIG. 1. As seen in FIGS. 6-7, for example, a metal sheet 202 can be patterned to form a half-patterned sheet. The metal sheet may have dimensions, e.g., 500 millimeters square, which match those of a panel used in the assembly of microelectronic elements with leadframes or tapes used in tape automated bonding processes. An exemplary thickness of the metal sheet prior to patterning ranges from 25 microns to 200 microns.

Mask patterns 204 can be provided or formed atop the metal sheet such as using a contact mask, transfer method or photolithographic exposure of a resist. Then, a removal process is applied to remove a portion of the thickness of the sheet between the mask patterns 204, as seen at areas 206 in FIG. 7. In particular examples, the removal process can be performed mechanically, chemically, or electrochemically, or a combination of such techniques. After the removal process, some portions of the original thickness of the sheet remain which will define the conductive elements 125 in a package 108 such as described above. Other portions whose thickness has been reduced typically will not become a part of the completed package.

Thereafter, as seen in FIG. 8, microelectronic elements and wire bonds are assembled with the half-patterned metal sheet. In one example, as seen in FIG. 8, wire bonds 130 are formed by bonding wires initially to a first set of conductive elements 125 to form bases 127 of the wire bonds thereon, and then bonding opposite ends of the wires to a second set of conductive elements 125'. The wire bonds 130 can be formed such that some portions of respective wire bonds lie in different planes which may be vertically or horizontally offset from one another, or both vertically and horizontally offset from one another. The second set of conductive elements 125' may be temporary elements as will be described further below.

A first layer of microelectronic elements 112 can be attached to the half-patterned metal sheet via an adhesive 113, such that the front (contact-bearing) faces of the microelectronic elements face away from the metal sheet. Referring to FIG. 9, a plurality of the microelectronic elements can be stacked one atop the other through an adhesive. As particularly shown, edge surfaces 116 of adjacent microelectronic elements can be horizontally offset from one another such that the stack has a stair step configuration.

Wire bonds or other electrically conductive structure 126 can be formed which electrically couples the microelectronic elements to the conductive elements and which may also electrically couple the microelectronic elements with one another.

Subsequently, as illustrated in FIG. 10, an encapsulation region 210 can be formed having dimensions corresponding to the horizontal dimensions of the half-patterned metal sheet. In one example, the encapsulation region can be formed by placing the half-patterned metal sheet with the microelectronic elements and wire bonds attached thereto in a cavity of a mold and then flowing an encapsulant into the mold cavity and permitting or causing the encapsulant to harden.

A half-patterned portion 208 of the metal sheet can be removed after forming the panel-wide encapsulation, such as through a chemical or mechanical technique, or a combination thereof. In a particular example, the half-patterned portion 208 of the metal sheet is not completely removed, but instead some parts of it are allowed to remain as a metal die attach pad or other thermally or electrically conductive feature of the package. FIG. 10 further illustrates dicing lanes 211 along which a saw or other cutting instrument can be passed to separate adjacent packages 108 from one another.

Figure 12:
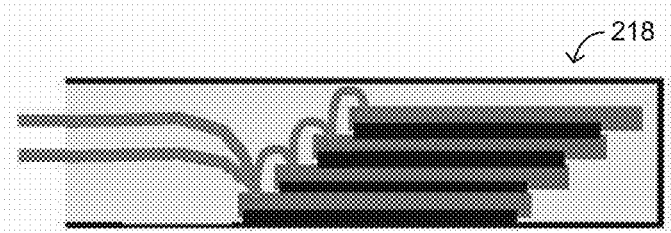
FIG. 12 is a sectional view depicting a microelectronic package in accordance with an embodiment disclosed herein.

Referring now to FIG. 11, in a variation of the above-described fabrication method, the metal sheet need not be pre-patterned before assembling wire bonds and microelectronic elements thereto. In this example, wire bonds 130' are formed directly between one or more of the microelectronic elements of the at least one microelectronic element and a surface of the metal sheet 202'. First package contacts at a first major surface of the package 218 are omitted. After forming the wire bonds, an encapsulation region can be formed over the assembled structure while still in form of a panel, and then the metal sheet or portion thereof can be removed and packages diced therefrom, resulting in a package 218 having a structure such as seen in FIG. 12.

Figure 13:
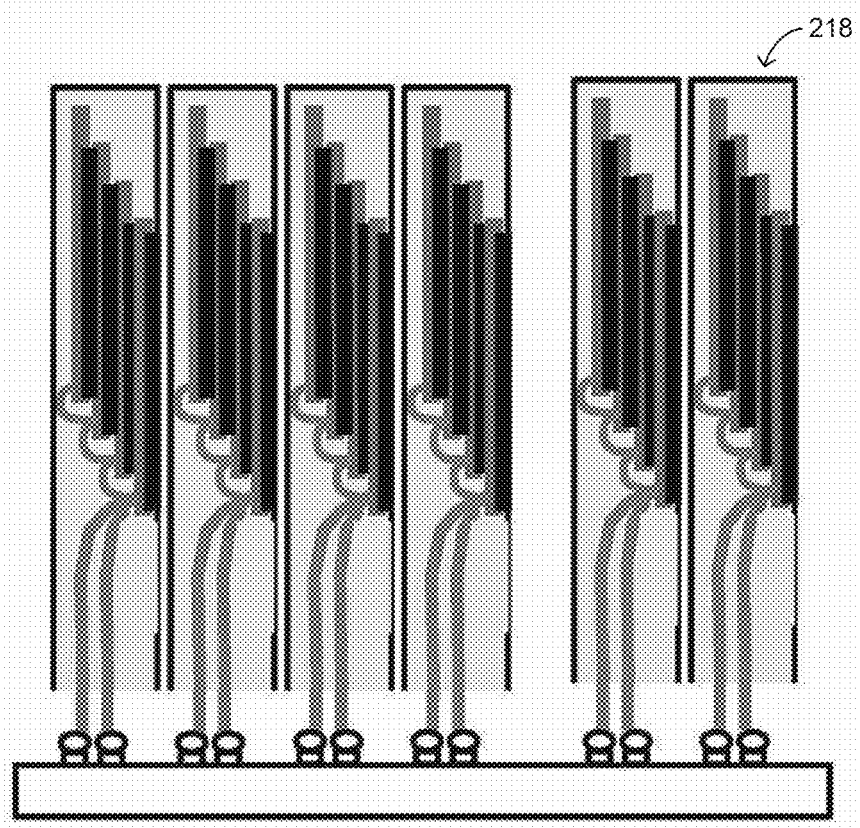
FIG. 13 is a sectional view depicting a microelectronic assembly in accordance with an embodiment disclosed herein.

Similar to that described above relative to FIG. 2, a plurality of such packages 218 can be assembled in a stacked arrangement and electrically coupled with a substrate as seen in FIG. 13. Adhesive layers and/or gaps can be provided between adjacent major surfaces of the packages such as in the examples described above.

Figure 14:
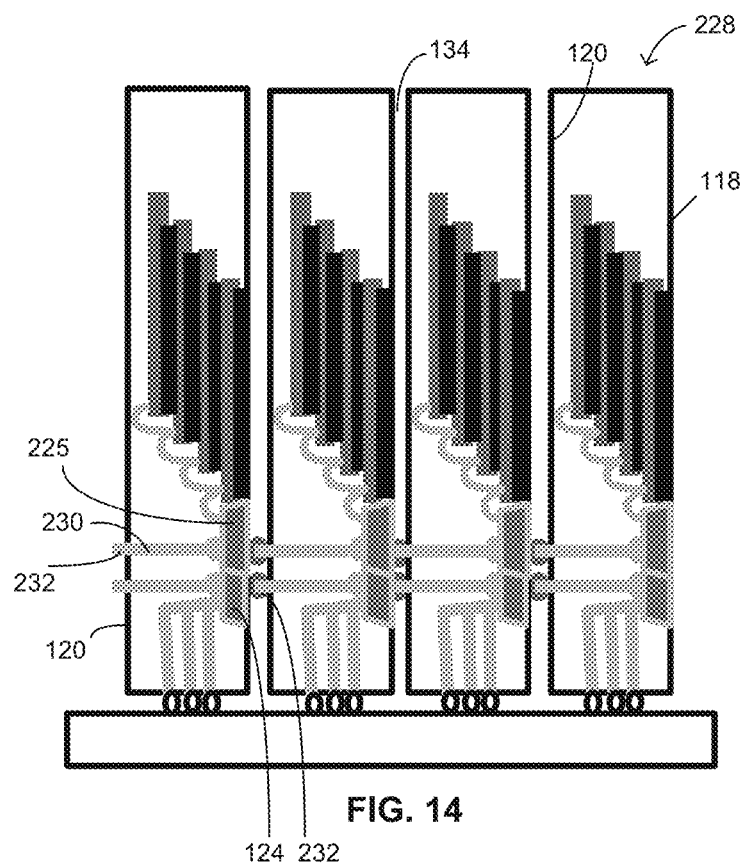
FIG. 14 is a sectional view depicting a microelectronic assembly in accordance with a variation of an embodiment disclosed herein.

FIG. 14 illustrates a further variation of the embodiment described above relative to FIGS. 1-5, but in which each package 228 comprises additional second package contacts 232 at their respective second major surfaces 120. As seen in FIG. 14, the additional second package contacts 232 of each package can be defined by portions of additional wire bonds 230. Such wire bonds 230 have bases metallurgically joined with bond surfaces of conductive elements 225 adjacent a first major surface 118 of the package 228. In a particular example, the additional wire bonds 230 can be formed with portions extending above the second major surface 120 of the encapsulation region using film-assisted molding, or by removing material at the second major surface after forming the additional wire bonds 230. In another example, the additional wire bonds do not project above the second major surface, but are nevertheless available at the second major surface for electrical interconnection either directly as the additional second package contacts 232 with other components. In a particular example, the additional wire bonds have portions flush with or recessed relative to the second major surface in one or more depressions therein, and the additional second package contacts 232 comprise electrically conductive structure coupled with the wire bonds.

Thus, as seen in FIG. 14, the additional second package contacts 232 at the second major surfaces of respective packages in the stack can be electrically coupled with first package contacts 124 at the first major surfaces of other packages adjacent to such packages in the stack. For example, the additional second package contacts 232 of respective packages in the stack can be aligned with and metallurgically joined or otherwise conductively connected with the first package contacts 124 of the packages adjacent thereto in the stack. Solder or other electrically conductive material may be used to bond the second package contacts 232 of each package to the first package contacts of the package adjacent thereto. Optionally, an adhesive material can bond the major surfaces of adjacent microelectronic packages with one another. In particular examples, the adhesive material may have electrically or thermally insulating properties or both electrically and thermally insulating properties.

Figure 15:
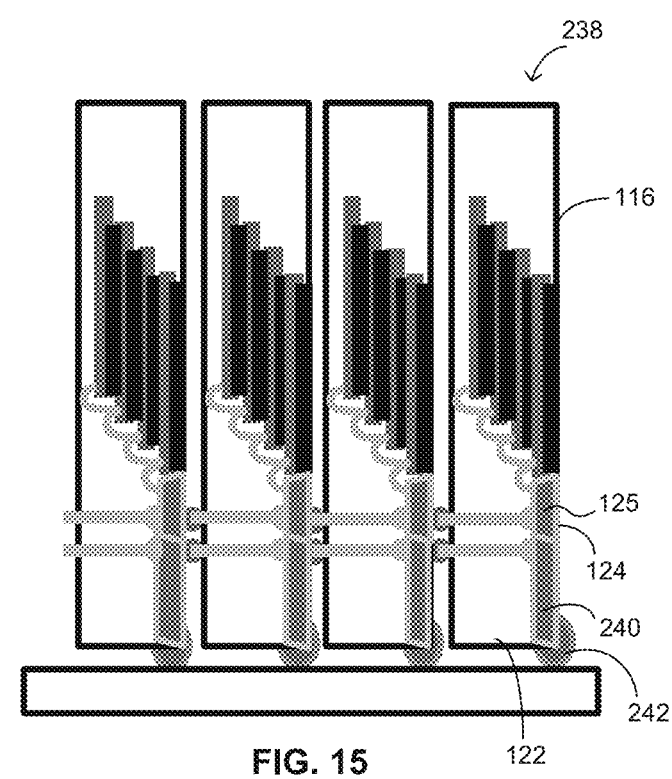
FIG. 15 is a sectional view depicting a microelectronic assembly in accordance with a variation of an embodiment disclosed herein.

Referring to FIG. 15, in a variation of the particular example seen in FIG. 14, alternative electrically conductive structure 240 such as patterned portions of a metal sheet, or leadframe elements among others, is substituted for the wire bonds 130 that extend to the second package contacts at the peripheral surface 122 of each microelectronic package 238. In the example seen in FIG. 15, the alternative conductive structure 240 has surfaces at the first major surface 118 and the peripheral surface 122 of each package 238, and joining elements 242 such as solder or other electrically conductive bond material contact both such surfaces. However, it is sufficient for a surface of the conductive structure 240 to be at only one of the first major surface 118 and the peripheral surface 122 of each package, so long as the method provided for electrically interconnecting the packages with the substrate provides sufficient electrical and/or mechanical coupling between each package and the substrate.

Figure 16:
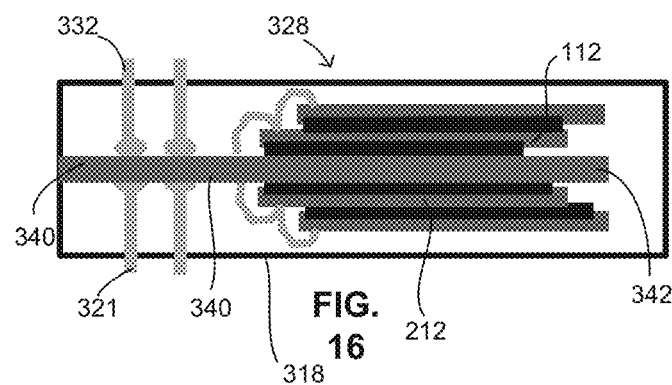
FIG. 16 is a sectional view depicting a microelectronic package in accordance with an embodiment disclosed herein.
Figure 17:
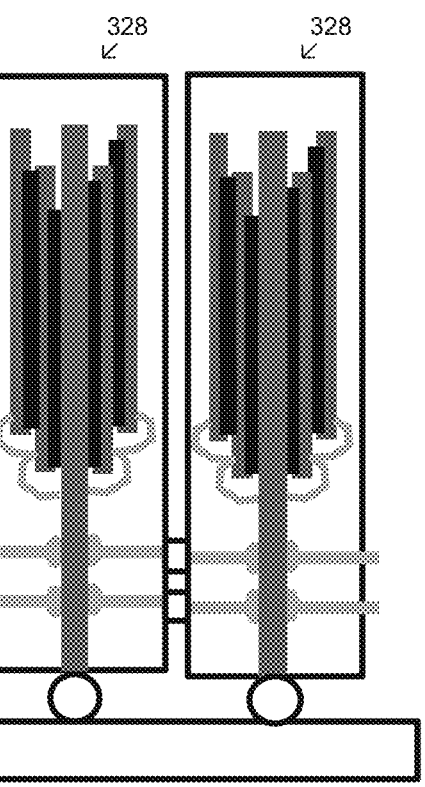
FIG. 17 is a sectional view depicting a microelectronic assembly in accordance with a variation of an embodiment disclosed herein.

Referring now to FIGS. 16-17, in a further example, each package 328 comprises at least one additional microelectronic element 212 or stack of microelectronic elements 212 can be assembled on a side of a metal die attach pad 342 opposite a surface above which the at least one microelectronic element 112 is positioned. The at least one microelectronic element 212 can be electrically coupled with the alternative conductive structure 340 in a manner similar to the interconnections between the at least one microelectronic element and the conductive elements 125 described above regarding FIG. 1, except as to their position being on a side opposite from microelectronic elements 112. As also seen in FIGS. 16-17, wire bonds extend from bond surfaces on opposite sides of the alternative conductive structure 340. Second, unencapsulated portions of the wire bonds at the first and second major surfaces 318, 320 respectively of the package 328 define the first package contacts 324 and the second package contacts 332, respectively. Alternatively, although not shown, the second portions of the wire bonds in FIGS. 16-17 can be electrically coupled with the first package contacts and second package contacts, respectively.

Figure 18:
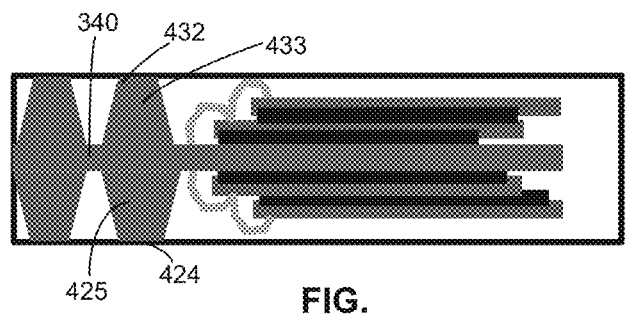
FIG. 18 is a sectional view depicting a microelectronic package in accordance with an embodiment disclosed herein.

In a further variation seen in FIG. 18, the first package contacts 424 and the second package contacts 432 can be coupled with the alternative conductive structure 340 through features such as respective substantially rigid metal posts 425 and 433. In one example, the contacts 424, 432 are surfaces of the substantially rigid metal posts 425, 433. In particular examples, the metal posts can be formed of a metal such as copper, nickel, copper alloy, or aluminum, or combination thereof, for example, such as by plating or etching processes or a combination of plating and etching processes. In another example, the posts can be formed separately and then metallurgically joined to surfaces at opposite sides of the alternative conductive structure 340. In one example, a metal sheet can be patterned from opposite major surfaces thereof to form the alternative conductive structure and the metal posts integral therewith.

Figure 19:
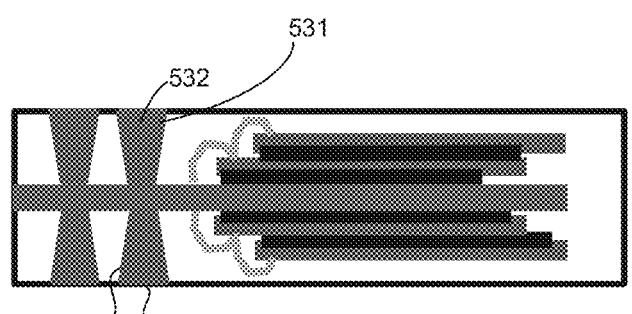
FIG. 19 is a sectional view depicting a microelectronic package in accordance with an embodiment disclosed herein.

FIG. 19 illustrates yet another variation in which the first and second package contacts 524, 532 are provided through electrically conductive material which is deposited into openings 521, 531 which extend from the respective major surfaces of the encapsulation region to surfaces of the alternative conductive structure at opposite sides thereof. In one example, the openings are formed during a process of molding the encapsulation region such as through structure protruding from a plate of the mold, or through temporary material provided at locations of the openings which material is removed after forming the molded encapsulation region. In another example, the openings are formed by removing material from the respective major surfaces to a depth at which electrical coupling can be made with the alternative conductive structure.

Figure 20:
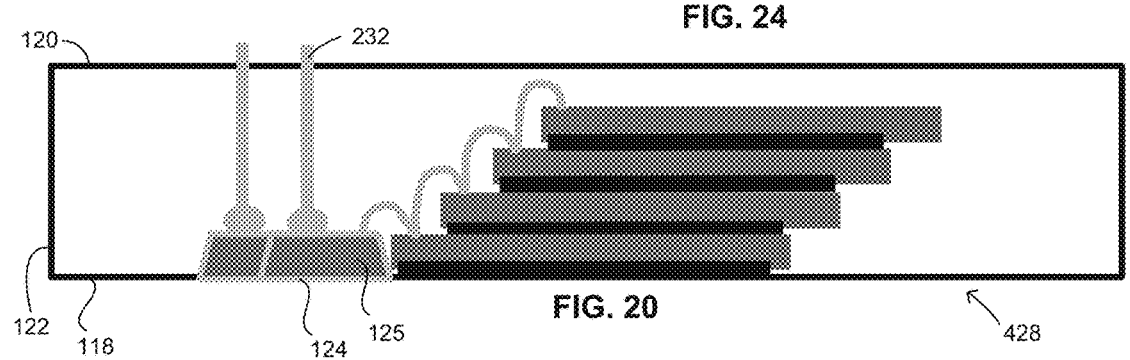
FIG. 20 is a sectional view depicting a microelectronic package in accordance with an embodiment disclosed herein.

Referring to FIG. 20, in a further variation of the embodiment shown and described above (FIG. 14), a microelectronic package 428 has first package contacts 126 at a first major surface 118, and second package contacts 232. However, unlike the embodiment of FIG. 14, the microelectronic package 428 omits the second package contacts at the peripheral surface 122 of the encapsulation region. Thus, connection to other microelectronic packages in a stack of the microelectronic packages is available through the first package contacts at the first major surface and the second package contacts at the second major surface but not available through contacts at the peripheral surface 122. In such case, the packages can be stacked and electrically connected one atop another. Connection between the packages and an element such as a substrate in the configuration shown in FIG. 2 requires additional conductive structure not seen in FIG. 20. One possible way to provide such connection can be to form an additional electrically conductive layer such as a redistribution layer atop one or more of the major surfaces of the microelectronic packages in a stack of such packages. Another way can be to attach a stack of the packages to a substrate with their first and second major surfaces parallel to the surface of the substrate to which they are attached. Still another way can be to provide a fixture or mounting device to which packages are mounted with the first and second major surfaces extending upwardly from the substrate, wherein the mounting device provides electrical interconnection between the packages and the substrate.

Figure 21:
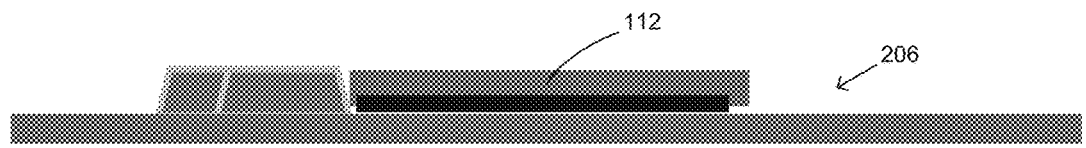
FIGS. 21, 22, 23 and 24 are sectional views depicting respective stages in a process of fabricating a microelectronic package in accordance with an embodiment disclosed herein.
Figure 22:
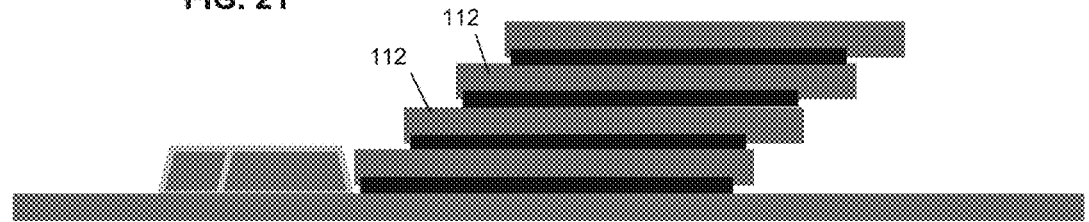
Figure 23:
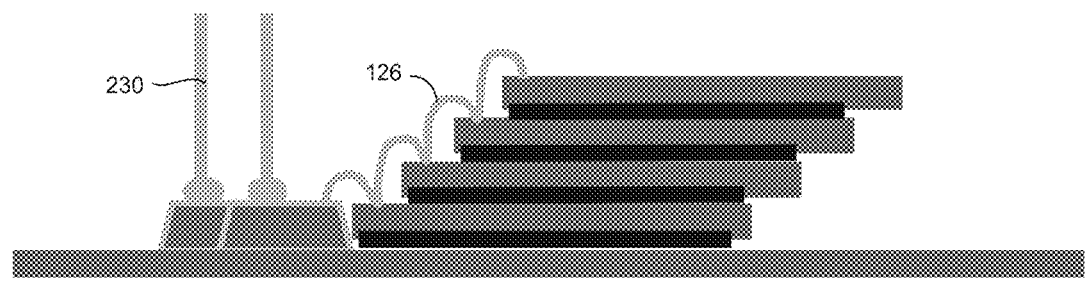
Figure 24:
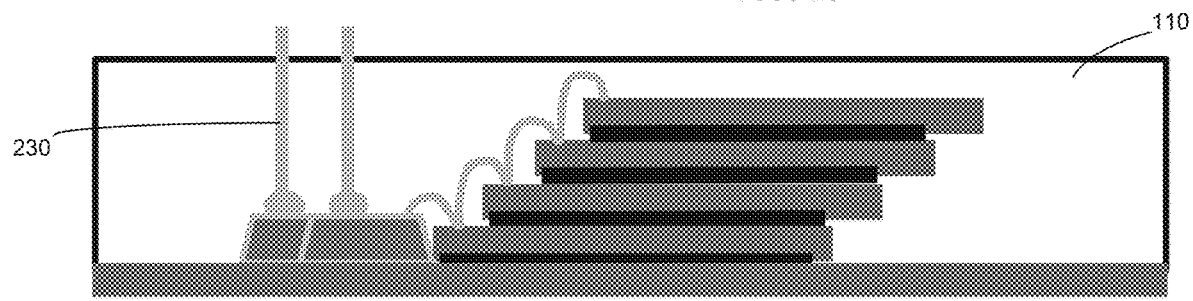

FIGS. 21-24 depict stages in a method of fabricating the package 428 in accordance with an embodiment disclosed herein. As seen in FIG. 21, similar to the method described above relative to FIGS. 6-10, a microelectronic element 112 is attached to a metal backing structure which may be a half-patterned portion of a half-patterned metal sheet 206. Additional microelectronic elements 112 can then be attached one atop the other above the half-patterned sheet, as seen in FIG. 22. Then, as seen in FIGS. 23-24, after forming wire bonds 230 and the electrically conductive structure 126, an encapsulation region 110 can be formed overlying the edge surfaces of the microelectronic elements and at least contacting and surrounding first portions of the wire bonds 230. Subsequently, metal overlying the first major surface 118 of the package can be removed, resulting in the package 428 as seen in FIG. 20.

Figure 25:
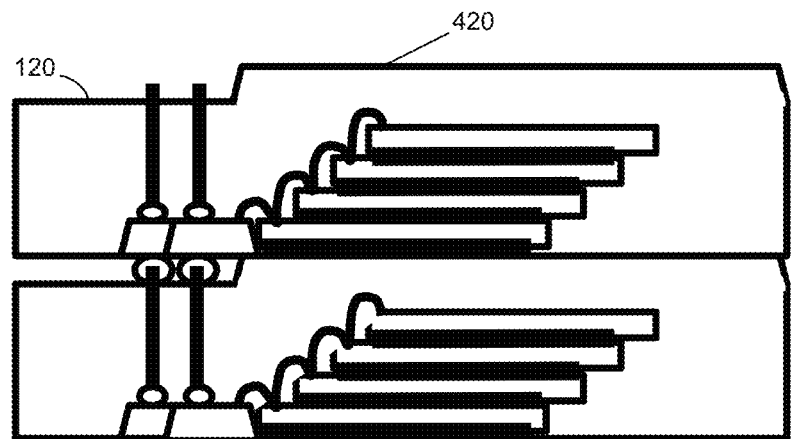
FIG. 25 is a sectional view depicting a microelectronic assembly in accordance with a variation of an embodiment disclosed herein.
Figure 26:
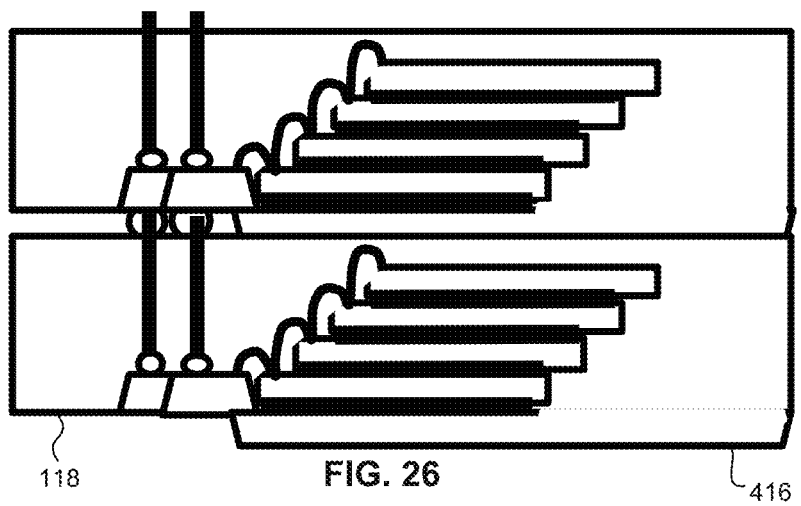
FIG. 26 is a sectional view depicting a microelectronic assembly in accordance with a variation of an embodiment disclosed herein.

Referring to FIG. 25, in a further variation, the encapsulation region may comprise a step surface 420 that is parallel to and laterally adjacent to the second major surface 120, the step surface and the adjacent major surface having different heights relative to the major surface of the package that is remote from that step surface. Thus, as seen in FIG. 25, the step surface 420 can be parallel to and laterally adjacent to a second major surface 120 of the package, and the step surface 420 and the second major surface have different heights from the first major surface 118. The step surface can facilitate the attachment of adjacent microelectronic elements by providing additional room for connections to be made between the first and second package contacts of adjacent packages in the stack. Referring to FIG. 26, in another variation, a step surface 416 can be provided that is parallel to and laterally adjacent to a first major surface 118 of the package, and a similar result can be achieved when the microelectronic elements are arranged and electrically interconnected in a stack thereof.

Figure 27:
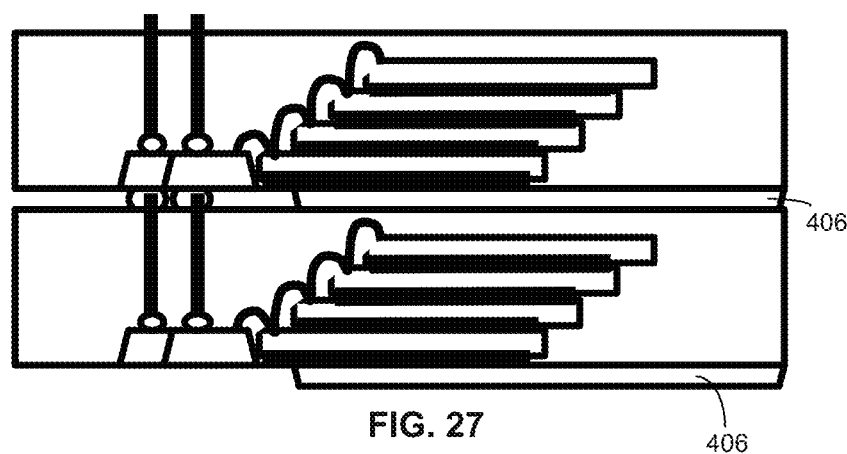
FIG. 27 is a sectional view depicting a microelectronic assembly in accordance with a variation of an embodiment disclosed herein.

In yet another variation as seen in FIG. 27, a metal die attach pad 406 can be provided underlying the at least one microelectronic element in the package. The die attach pad 406 can be a patterned portion of a metal sheet or a leadframe element, for example. In such case, electrical and/or heat transfer characteristics of the assembly of multiple microelectronic packages can be improved by the metal die attach pads above which the microelectronic elements are attached.

Figure 28:
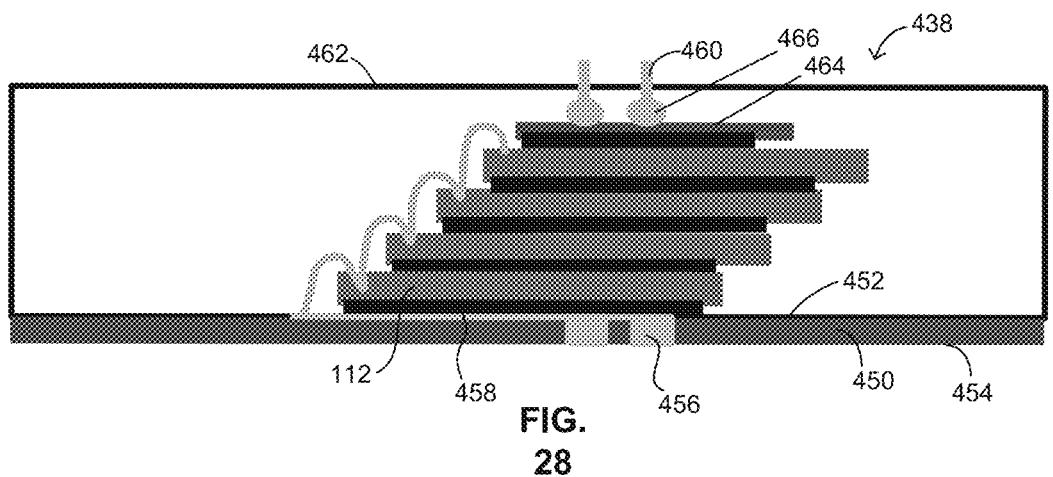
FIG. 28 is a sectional view depicting a microelectronic package in accordance with an embodiment disclosed herein.

Referring to FIG. 28, in a microelectronic package 438 in accordance with another embodiment, the at least one microelectronic element 112 is attached to a major surface 452 of a package substrate 450, e.g., a chip carrier, or dielectric element having a plurality of electrically conductive traces 458 thereon. Some or all of the traces are electrically coupled with first package contacts 456 at a major surface 454 of the substrate which faces away from the major surface 452 over which the at least one microelectronic element is attached. Major surface 454 may define a first major surface of the package 438. The at least one microelectronic element is attached to the package substrate at a position overlying an area of the surface 452 aligned with some of all of the electrically conductive traces. Alternatively, some or all traces may be routed outside an area occupied by the at least one microelectronic element. Some or all of the traces 458 may extend along the major surface 452 of the substrate which faces the at least one microelectronic element, or some or all of the traces may extend along the surface 454 which faces away from the at least one microelectronic element. First package contacts 456 are suitable for electrically interconnecting the package with corresponding contacts of at least one other component which may face the first package contacts 456.

As further seen in FIG. 28, second package contacts 460 are provided at a second major surface 462 of the package 438 that is remote from and typically substantially parallel to the first major surface 454. In a particular example, the second package contacts may be defined by unencapsulated second portions of wire bonds which have bases 466 metallurgically joined with electrically conductive elements 464 which overlie a surface of an uppermost microelectronic element of the at least one microelectronic element. Alternatively, the second package contacts 460 may be embodied per any of the examples discussed above regarding the second package contacts 132 shown in FIG. 1.

Figure 29:
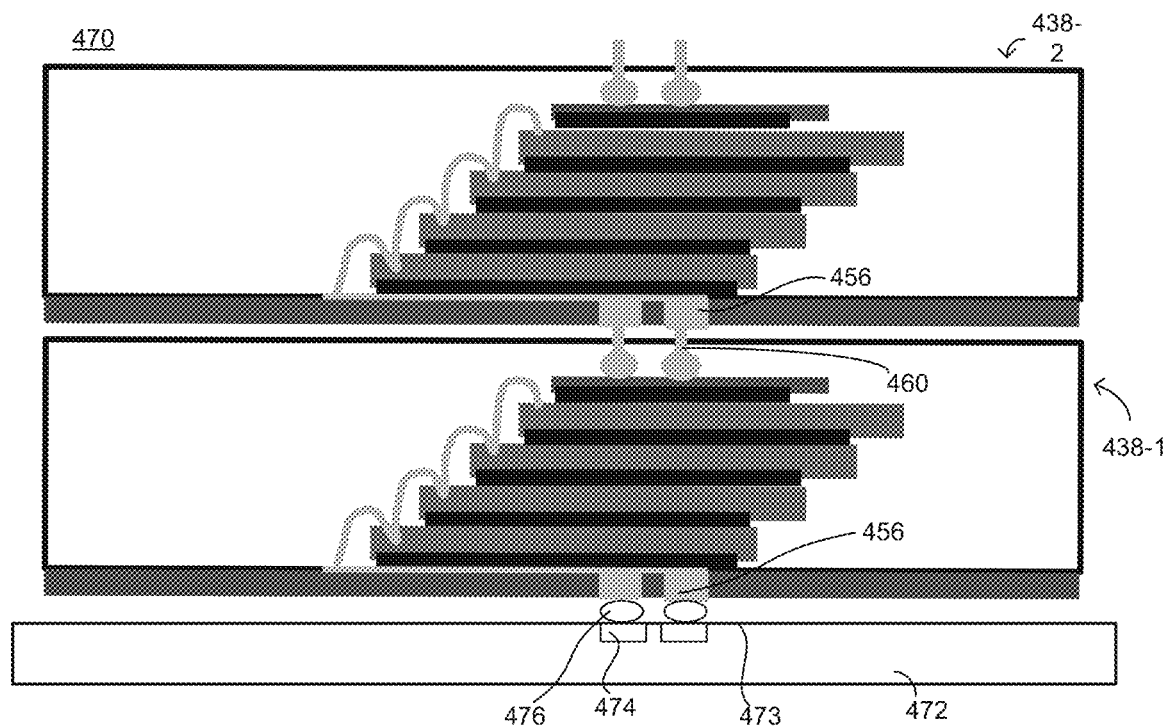
FIG. 29 is a sectional view depicting a microelectronic assembly in accordance with an embodiment disclosed herein.

FIG. 29 illustrates one possible assembly 470 of microelectronic packages 438-1, 438-2, each such package being as described above relative to FIG. 28. In the example seen in FIG. 29, the second package contacts 460 of a first microelectronic package 438-1 face and are electrically coupled with corresponding first package contacts 456 of a second microelectronic package 438-2 which overlie those second package contacts 460. The assembly may additionally comprise another component 472, for example, a circuit panel, having contacts 474 at a major surface 473 thereof, wherein first package contacts 456 of the lower microelectronic element 438-1 may face and be electrically coupled with the contacts 474 of the component 472.

Although not specifically shown in the Figures or particularly described in the foregoing, elements in the various Figures and various described embodiments can be combined together in additional variations that are not inconsistent with the foregoing description. Each of the claims of this document constitutes a separate embodiment, and combinations of the claims herein and/or different embodiments herein are within the scope of this disclosure.

The invention claimed is:

1. A microelectronic assembly including first and second microelectronic packages and a substrate having first and second opposite surfaces and substrate contacts at the first surface thereof, each microelectronic package comprising:
   at least one microelectronic element, each microelectronic element having a front surface defining a plane, a plurality of element contacts at the front surface and a plurality of edge surfaces extending away from the plane, wherein the plane of each microelectronic element is parallel to the plane of any other said microelectronic element;
   an encapsulation region overlying the edge surfaces of each microelectronic element, the encapsulation region having first and second major surfaces and peripheral surfaces extending between the major surfaces, the first and second major surfaces being substantially parallel to the plane of each microelectronic element, an interconnect surface of the encapsulation region comprising a surface selected from one or more of the second major surface and the peripheral surfaces;
   electrically conductive first package contacts at the first major surface of the encapsulation region;
   a plurality of wire bonds electrically coupled with one or more of the first package contacts, each wire bond having a portion contacted and surrounded by the encapsulation region; and
   a plurality of second package contacts at the interconnect surface, wherein the second package contacts are defined by portions of the wire bonds at the interconnect surface,
   wherein a peripheral surface of the encapsulation region of each microelectronic package faces the substrate, each microelectronic package further comprising third package contacts at the peripheral surface which faces the substrate, the third package contacts electrically coupled with at least one of the first package contacts and the at least one microelectronic element, and
   wherein the interconnect surfaces comprise the second major surfaces of the first and second microelectronic packages, wherein the second package contacts at the second major surface of the first microelectronic package are electrically coupled with the first package contacts at the first major surface of the second microelectronic package.

2. The microelectronic assembly as claimed in claim 1, wherein the at least one microelectronic element comprises a plurality of microelectronic elements stacked one above the front surface of the other.

3. The microelectronic assembly as claimed in claim 1, wherein the microelectronic package comprises leadframe elements at at least the first major surface, wherein the first package contacts comprise first surfaces of the leadframe elements.

4. The microelectronic assembly as claimed in claim 3, wherein each wire bond has a base formed atop a bond surface of one of the leadframe elements, wherein the encapsulation region overlies the base of the wire bond and at least a portion of the bond surface.

5. The microelectronic assembly as claimed in claim 1, wherein each microelectronic package further comprises leadframe elements, wherein the third package contacts are surfaces of the leadframe elements.

6. The microelectronic package as claimed in claim 1, wherein the at least one microelectronic element comprises a plurality of stacked microelectronic elements further comprising a metal die attach pad, the plurality of stacked microelectronic elements mechanically coupled with the die attach pad.

7. The microelectronic assembly as claimed in claim 6, wherein the stacked microelectronic elements are first stacked microelectronic elements mechanically coupled with a first surface of the die attach pad, the microelectronic package further comprising a plurality of second stacked microelectronic elements attached to a second surface of the die attach pad remote from the first stacked microelectronic elements.

8. The microelectronic package as claimed in claim 6, wherein at least some of the first package contacts and at least some of the second package contacts are aligned with an area of the front surface of at least one of the stacked microelectronic elements.

9. The microelectronic assembly as claimed in claim 1, wherein the encapsulation region of each microelectronic package has a step surface parallel and laterally adjacent to one of the first and second major surfaces, the step surface and the adjacent major surface having different heights.

10. A microelectronic assembly, comprising:
   a substrate having first and second opposite surfaces and substrate contacts at the first surface thereof; and
   first and second microelectronic packages, each microelectronic package comprising:
      at least one microelectronic element, each microelectronic element having a front surface defining a plane, a plurality of element contacts at the front surface and a plurality of edge surfaces extending away from the plane, wherein the plane of each microelectronic element is parallel to the plane of any other said microelectronic element;
      an encapsulation region overlying the edge surfaces of each microelectronic element, the encapsulation region having first and second major surfaces and peripheral surfaces extending between the major surfaces, the first and second major surfaces being substantially parallel to the plane of each microelectronic element, an interconnect surface of the encapsulation region comprising one of the peripheral surfaces;
      electrically conductive first package contacts at the first major surface of the encapsulation region;
      a plurality of wire bonds electrically coupled with one or more of the first package contacts, each wire bond having a portion contacted and surrounded by the encapsulation region; and
      a plurality of second package contacts at the interconnect surface, wherein the second package contacts comprise at least one of: portions of the wire bonds at the first peripheral surface, or electrically conductive structure coupled with the wire bonds,
   wherein the interconnect surface of each of the microelectronic packages faces the substrate, and
   at least some of the second package contacts of each microelectronic package face and are electrically coupled with the substrate contacts.

11. The microelectronic assembly as claimed in claim 10, wherein each of the microelectronic packages comprises a plurality of the microelectronic elements stacked one atop the other.

12. The microelectronic assembly as claimed in claim 10, further comprising electrically conductive structure coupled with and extending above the plurality of microelectronic elements, wherein the wire bonds are electrically coupled with the electrically conductive structure.

13. The microelectronic assembly as claimed in claim 12, wherein the electrically conductive structure comprises second wire bonds coupled with the plurality of microelectronic elements.

14. A method of making a microelectronic assembly including first and second microelectronic packages and a substrate having first and second opposite surfaces and substrate contacts at the first surface thereof, comprising:
   forming the microelectronic packages, the forming of each microelectronic package including:
   stacking a plurality of microelectronic elements, each microelectronic element having a front surface defining a plane, a plurality of contacts at the front surface and a plurality of edge surfaces extending away from the plane, the microelectronic elements stacked with the planes parallel to one another, each microelectronic element electrically coupled with first package contacts;
   forming wire bonds electrically coupled with the first package contacts, the wire bonds extending in a direction away from the first package contacts; and
   forming an encapsulation region overlying the edge surfaces, the encapsulation region having first and second major surfaces and peripheral surfaces between the major surfaces, the first and second major surfaces being substantially parallel to the planes of the microelectronic elements,
   wherein electrically conductive second package contacts at an interconnect surface selected from a major surface and the peripheral surfaces of the encapsulation region are electrically coupled with the first package contacts through the wire bonds,
   wherein the second package contacts are defined by portions of the wire bonds at the interconnect surface, and
   wherein the interconnect surfaces are peripheral surfaces of the first and second microelectronic packages which face the substrate and at least some of the second package contacts at the facing peripheral surface of each microelectronic package are electrically coupled with the substrate contacts.

15. The method as claimed in claim 14, wherein the stacking includes stacking a plurality of microelectronic elements atop a die attach pad of a leadframe, wherein the package contacts include leadframe contacts, at least some of the leadframe contacts being laterally spaced apart from an edge of the die attach pad.

16. The method as claimed in claim 14, wherein the package contacts comprise package contacts at a peripheral surface of the encapsulation region.

17. The method as claimed in claim 14, wherein the package contacts comprise package contacts at at least one of the first or second major surfaces.

\* \* \* \* \*